(12) United States Patent
Samoilov et al.

(10) Patent No.: US 6,455,814 B1
(45) Date of Patent: Sep. 24, 2002

(54) BACKSIDE HEATING CHAMBER FOR EMISSIVITY INDEPENDENT THERMAL PROCESSES

(75) Inventors: Arkadii V. Samoilov, Sunnyvale; Dale R. DuBois, Los Gatos; Lance A. Scudder, Santa Clara; Paul B. Comita, Menlo Park; Lori D. Washington, Union City; David K. Carlson, Santa Clara; Roger N. Anderson, Sunnyvale, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/007,852

(22) Filed: Nov. 7, 2001

(51) Int. Cl.[7] .................................................. F27B 5/14
(52) U.S. Cl. ................. 219/390; 219/405; 219/411; 392/416; 118/724; 118/725; 118/50.1
(58) Field of Search ................................ 219/390, 405, 219/411; 118/724, 725, 50.1; 392/416, 418, 407, 411, 420–422

(56) References Cited

U.S. PATENT DOCUMENTS

| | | | |
|---|---|---|---|
| 4,796,562 A | | 1/1989 | Brors et al. |
| 4,804,007 A | | 2/1989 | Bran |
| 4,891,499 A | | 1/1990 | Moslehi |
| 5,446,825 A | | 8/1995 | Moslehi et al. |
| 5,452,396 A | * | 9/1995 | Sopori ........................ 392/416 |
| 5,480,489 A | | 1/1996 | Hasegawa |
| 5,650,082 A | * | 7/1997 | Anderson ................... 219/390 |
| 5,715,361 A | | 2/1998 | Moslehi |
| 5,790,750 A | * | 8/1998 | Anderson ................... 392/416 |
| 6,107,192 A | * | 8/2000 | Subrahmanyan et al. ... 438/637 |
| 6,254,686 B1 | * | 7/2001 | Comita et al. .............. 118/724 |
| 6,311,638 B1 | * | 11/2001 | Ishii et al. .......... 118/723 MW |

* cited by examiner

*Primary Examiner*—Teresa Walberg
*Assistant Examiner*—Shawntina T. Fuqua
(74) *Attorney, Agent, or Firm*—Blakely, Sokoloff, Taylor & Zafman

(57) ABSTRACT

An apparatus that includes a reflector having a mirrored surface facing down, a glass structure located beneath the reflector, a susceptor within the glass structure having a surface facing up that is capable of holding a part to be processed, and one or more radiant heat sources directed at and located beneath the glass structure.

17 Claims, 4 Drawing Sheets

SECTION A-A

BACKSIDE HEATING CHAMBER FOR EMISSIVITY INDEPENDENT THERMAL PROCESSES

FIELD OF THE INVENTION

The present invention pertains to thermal processing a semiconductor wafer. More particularly, the present invention relates to a method and apparatus for emissivity independent heating of the wafer during the processing.

BACKGROUND OF THE INVENTION

Apparatus to fabricate a thin film using such techniques as chemical vapor deposition (CVD) or atomic layer deposition (ALD) are routinely used in the manufacture of semiconductor wafers. In a film forming apparatus, a reproducible temperature distribution across the wafer is extremely important for film uniformity.

The most common epitaxial (epi) film deposition reactors used in modern silicon (Si) technology are similar in design. A quartz reaction chamber contains the wafer support, the susceptor, which is rotated to improve the deposition uniformity across the wafer. Only one wafer is processed at a time. Process and carrier gases flow over the wafer in a laminar mode and parallel to the wafer surface. The wafer is heated by tungsten-halogen lamps located underneath and above the reaction chamber, radiating through the quartz and directly heating the wafer and susceptor. The lamps and the quartz walls of the chamber are air-cooled to protect the lamps and to prevent the risk of Si depositing on the reactor walls. The wafer is loaded and unloaded fully automatically and the reaction chamber is separated from the ambient by load locks and a wafer transfer chamber.

The susceptor can be a graphite disc with a SiC coating to smooth out local temperature variations from the radiant heat source. At temperatures in the 500–900° C. range, the growth of epi Si (silicon) and SiGe (silicon germanium) is very temperature sensitive and epi growth is often effected on patterned wafers in selective or in blanket growth mode.

A patterned wafer (having circuitry and devices) can have a different emissivity characteristic than a blanket wafer. In addition, a pattern on a wafer can have a different emissivity characteristic than a different pattern on another wafer. Heat can be emitted from the wafer with the first pattern different than with the different pattern and the temperature distribution of wafers with different patterns can vary which can vary the deposition rate and characteristics of films being placed on the wafer. Since a varying thermal profile on a wafer can affect reaction rates, the varying thermal profile can determine a film deposition rate. As a result, a change in wafer patterns can require a re-tuning of the process to confirm that correct heating of the wafer is accomplished. In addition to film deposition processes, any process involving thermal treatment such as bake, anneal, etc. can be affected by the wafer emissivity.

Often in thermal processing reactors, such as in Epi CVD apparatuses, the substrate is heated from both the device side and the non-device side. Using this dual side heating approach, the temperature distribution across the wafer is very sensitive to the emissivity of the surface onto which a film is deposited. As a result, the deposition rate will be different at different locations on the wafer. The deposition rate also varies between wafers having different patterns on their front surface due to the different emissivity of these patterns. Moreover, the deposition rate can change during the deposition itself because the species which are being deposited can change the wafer's emissivity. In addition to the dependence of the deposition rate on emissivity, the chemical composition of the deposited film will also be emissivity sensitive because incorporation of species into grown films can be temperature dependent.

SUMMARY OF THE INVENTION

An apparatus for heating and monitoring a wafer that reduces dependence of the temperature distribution along the wafer, to wafer emissivity, is disclosed. The apparatus provides a susceptor capable of holding a wafer that is placed in a process chamber within quartz domes. An array of lamps placed outside the quartz domes heat a susceptor backside. A reflector is placed outside the quartz domes to have a mirrored surface face the wafer device side and reflect heat back onto the wafer. The shape of the reflector is optimized to provide the best temperature uniformity. The chamber is designed to restrict light from the lamps from leaking around the susceptor to heat the wafer directly. An optical thermometer may be placed above the reflector to read a wafer device side temperature through a hole in the reflector.

BRIEF DESCRIPTION OF THE DRAWINGS

The present invention is illustrated by way of example and not by way of limitation in the figures of the accompanying drawings, in which like references indicate similar elements and in which.

DETAILED DESCRIPTION

An apparatus for thermal processing wafers is described. The apparatus provides heating to the backside of the wafer with a mirrored surface to reflect back heat escaping the opposite side of the wafer. Wafer backside (non-device side) heating only reduces the effects of the water device side emissivity on wafer heating. This apparatus reduces the dependence of wafer emissivity on film deposition as compared to apparatus with direct radiant heating to both sides of the wafer. Such thermal processing may be the epitaxial deposition of various coatings such as, for example, silicon, silicon-germanium, and silicon-germanium-carbon films. The deposition may be accomplished through one of several methods for film deposition such as chemical vapor deposition or atomic layer deposition. Other processes where this invention can be used include but not limited to are silicon oxide, silicon nitride, polycrystalline deposition, and more broadly, any temperature-dependent treatment or process.

In the following description, for purposes of explanation, numerous specific details are set forth in order to provide a thorough understanding of the present invention. It will be evident, however, to one skilled in the art that the present invention may be practiced without these specific details. In some instances, well-known structures and devices are shown in block diagram form, rather than in detail, in order to avoid obscuring the present invention. These embodiments are described in sufficient detail to enable those skilled in the art to practice the invention, and it is to be understood that other embodiments may be utilized and that logical, mechanical, electrical, and other changes may be made without departing from the scope of the present invention.

The present invention can be implemented by an apparatus for performing the operations herein. This apparatus may be specially constructed for the required purposes, or it may comprise a general-purpose process chamber, selectively activated or reconfigured to achieve the required purposes.

It is to be understood that various terms and techniques are used by those knowledgeable in the art to describe communications, protocols, applications, implementations, mechanisms, etc.

Figure 1:
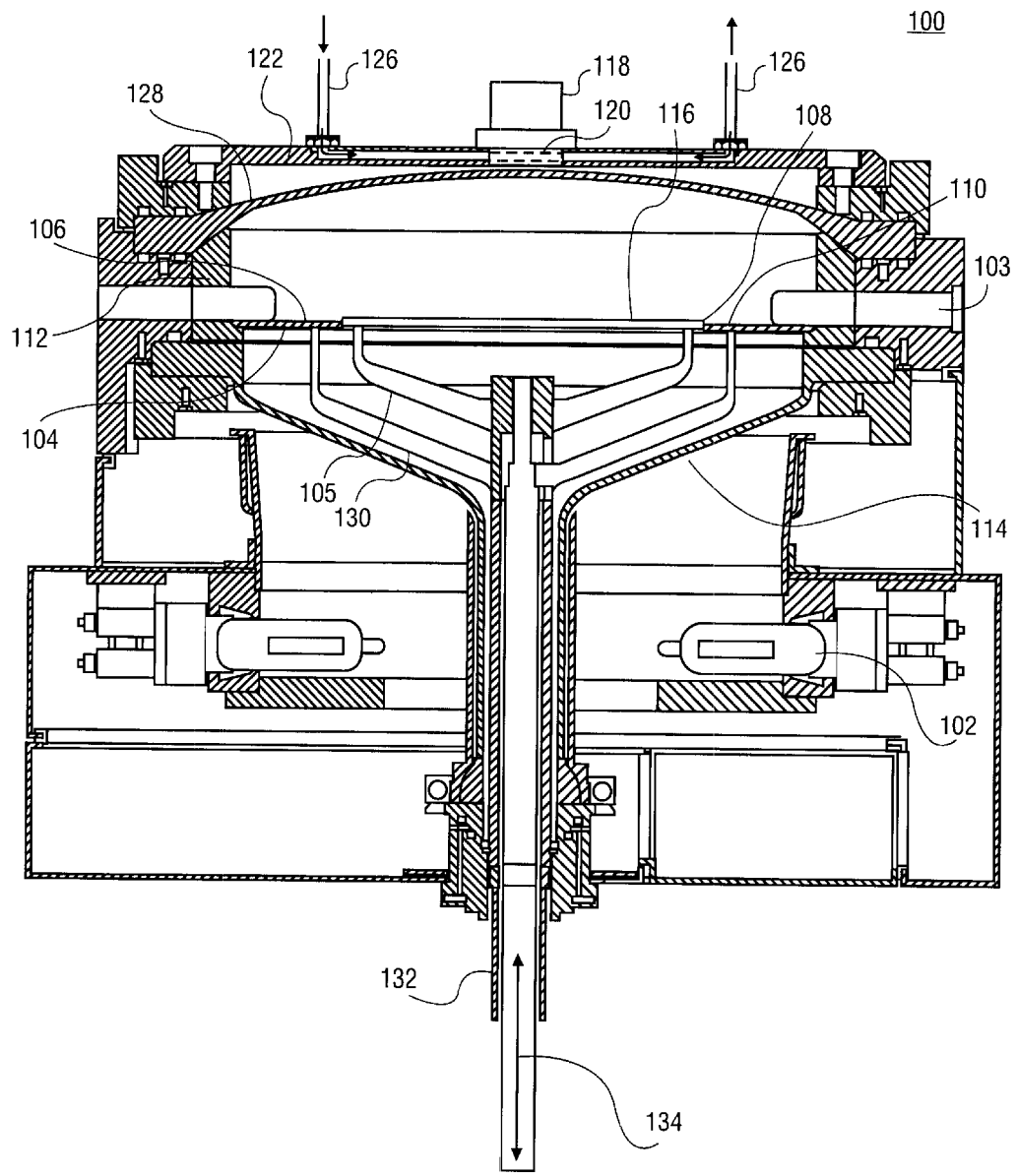
FIG. 1 is an illustration of a backside heating chamber for emissivity independent thermal processing.

FIG. 1 illustrates a backside heating chamber for emissivity independent thermal processes in which the techniques described may be applied. In one embodiment, the backside heating chamber for emissivity independent thermal processing (process chamber) 100 includes an array of radiant heating lamps 102 for heating a backside 104 of a susceptor 106. A wafer 108 (not to scale) can be brought into the process chamber 100 and positioned onto the susceptor 106 through a loading port 103. Pin lifts 105, passing through holes in the susceptor 106, can raise up to accept the wafer 108 and then translate down to position the wafer 108 device side up 116 on a front side 110 of the susceptor 106. The susceptor 106 can be located inside the process chamber 100 and within an upper dome 128 and a lower dome 114 where the domes 128 and 114 can be made from clear glass such as a quartz. One or more lamps, such as an array of lamps 102, can be located outside and under the lower dome 114. The loading port 103 can include one or more rings or partial rings to act as a liner 112 that can line the edge of the susceptor 106 to minimize or prevent leakage of heat from the lamps 102 to the wafer front (device) side 116. The liners 112 can be made from a non-light conducting material such as an opaque quartz. By using a liner 112 of opaque quartz, most of the heating energy reaching the wafer 108 is conducted through the susceptor 106 rather than by leakage from the lamps 102 around the susceptor 106 to the wafer front side 116. Since heat transfer through the susceptor 106 to the wafer 108 is conductive and therefore emissivity independent, deposition of films onto the wafer 108 are therefore emissivity independent.

As a result of backside heating of the wafer 102 from the susceptor 106, the use of an optical thermometer 118 for temperature measurements on wafer front (device) sides 116 can be performed. This temperature measurement by the optical thermometer 118 can be done on wafer device sides 116 having an unknown emissivity since heating the wafer front side 116 in this manner is emissivity independent. As a result, the optical thermometer 118 can only sense radiation from the hot wafer 108 that conducts from the susceptor 106, with minimal background radiation from the lamps 102 directly reaching the wafer front side 116 or the optical thermometer 118.

The reflector 122 can be placed outside the upper dome 128 to reflect infrared light that is radiating off the wafer 108 back onto the wafer 108. Due to the reflected infrared light, the efficiency of the heating will be improved by containing heat that could otherwise escape the system 100. A further aspect is that with the heat radiating off the wafer, continually reflected back onto the wafer, a frequency distribution of this heat will approach a near black body radiation of the wafer 108. As a result, any direct light leaking from below the wafer to reflect onto the wafer front side 116 can only contribute a small percentage of the total heat to the wafer, and therefore emissivity effects on the front surface 116 resulting from this leakage, will be minimized.

By reducing the dependence of the wafer heating on the wafer emissivity, the use of the optical thermometer 118 to read a surface temperature of the wafer device side 116 can therefore become effective. The effectiveness of the optical thermometer 118 has resulted since the reduced percentage of the light due to the lamps decreases the percentage of "parasitic" signal in the optical thermometer. In addition, the optical thermometer 118 may not have to be recalibrated when a wafer circuit design (pattern) is changed since wafer heating is emissivity independent with a low error resulting from leakage.

In one embodiment, the reflector 122 can be made of a metal such as aluminum or stainless steel. The aluminum can have machined channels 124 to carry a flow of a fluid 126 such as water for cooling the reflector 122. In addition, the efficiency of the reflection can be improved by coating a reflector area with a highly reflective coating such as with gold. The reflector 122 can have a hole 120 through a location such as the center of the reflector 122, through which to sense a temperature of the wafer 108 with the optical thermometer 118. In one embodiment, the susceptor 106 can be manufactured from a material such as graphite and coated with silicon carbide. The susceptor 106 can be supported by struts 130 and a central shaft 132 that can move the wafer 108 in an up and down direction 134 during wafer 108 loading and unloading.

In one embodiment (FIG. 1), the upper dome 128 of the process chamber 110 is curved. The degree of curvature and the thickness of the quartz glass material of the upper dome 128 can be dependent on the pressure differential acting on the sides of the upper dome 128. In this embodiment, the exterior pressure is one atmosphere and the pressure during processing within the upper dome 128 and the lower dome 114 is approximately 0.1–700 Torr. As a result, the quartz glass thickness of the upper dome 1.28 can be approximately 0.12 inch and the radius of curvature approximately 15.0 inches.

Figure 2:
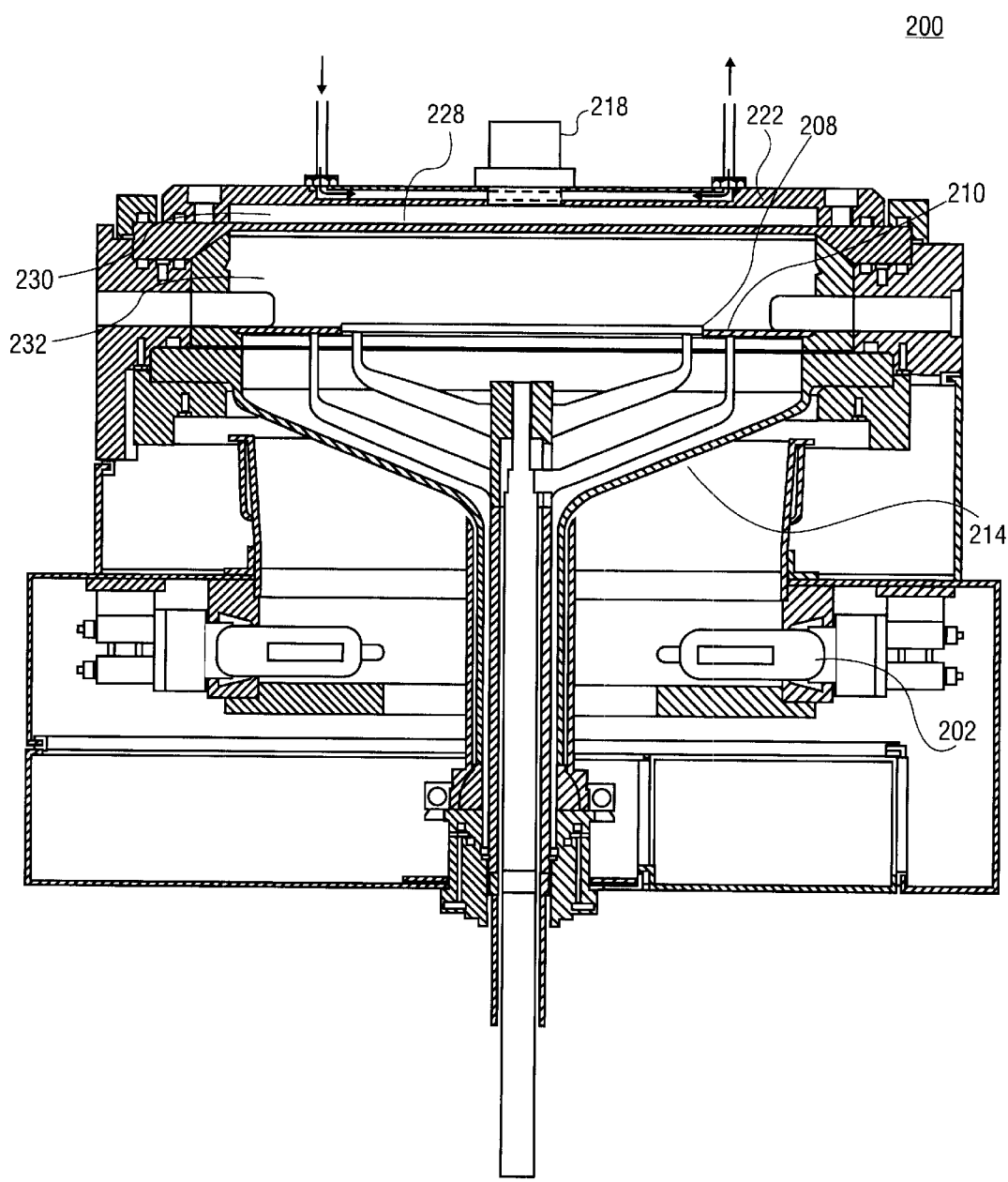
FIG. 2 is an illustration of the backside heating chamber with a flat upper dome.

In an alternate embodiment as shown in FIG. 2, the pressures on both sides of the quartz dome 230 and 232 can be kept approximately the same. With no structural concern, the upper dome 228 can be flat and the reflector 222 can be placed closer to the wafer 208 to improve efficiency. To ensure equal pressure acting on both sides of the upper dome 228, the volumes on either side 230 and 232 of the upper dome 228, can be connected to each other. If the volumes 230 and 232 on either side of the upper dome 228 are not connected, a pressure control system (not shown) could be in place to ensure closeness of pressures in the two volumes 230 and 232 to not break the upper dome 228.

Figure 3A:
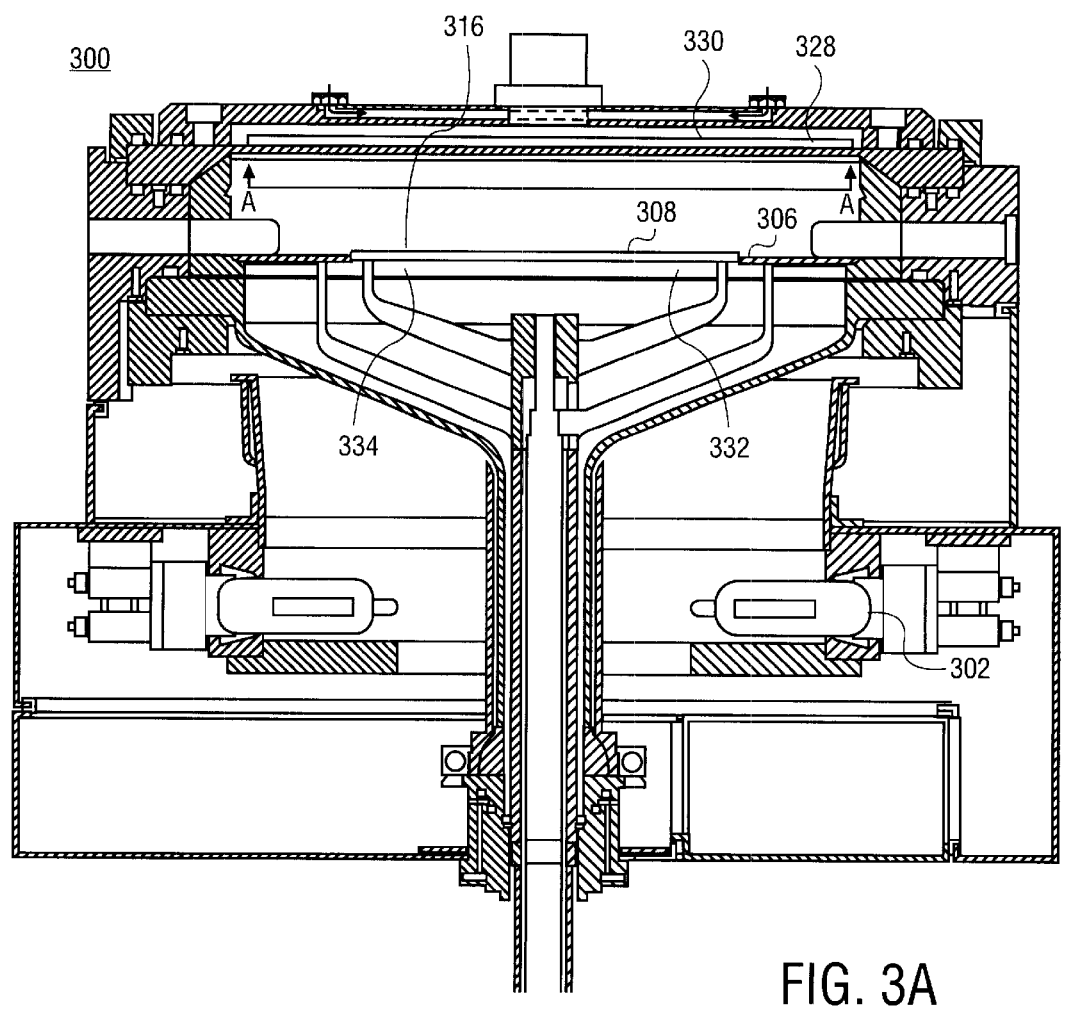
FIG. 3A is an illustration of the backside heating chamber with a ribbed flat upper dome.
Figure 3B:
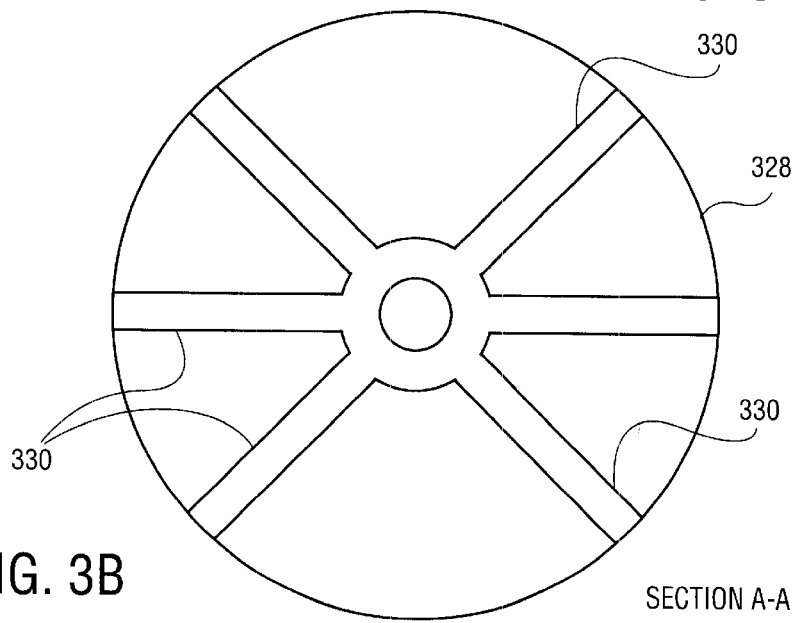
FIG. 3B is an illustration of a top view of the ribbed flat upper dome.

In another alternate embodiment shown in FIGS. 3A & 3B, the upper dome 328 of the process chamber 300 is reinforced with ribbing 330. Where there is a significant pressure differential acting on the upper dome 328, the upper dome 328 can be made stronger by using these stiffening ribs 330. As a result of ribbing 330, the upper dome 328 can still be substantially flat where facing the wafer 308. FIG. 3A further illustrates a susceptor 306 that is centerless meaning there is a hole 334 in the susceptor 306 and the wafer 308 can contact the susceptor 306 at the edges of the hole 334. The centerless susceptor 306 can allow radiation from the lamps 302 can strike a backside 332 of the wafer 308 directly, and heat can propagate through the thickness of the wafer 308 to heat the wafer front side 316. Only one form of ribbing 330 is shown, however, it should be appreciated that a variety of ribbing designs are possible to meet pressure differential considerations. Also, a variety of chamber shapes are possible other than the circular geometry shown in FIGS. 1–3. To improve the ability of the upper dome 328 to withstand a pressure differential, rectangular or elliptical chamber shapes are also possible.

Figure 4:
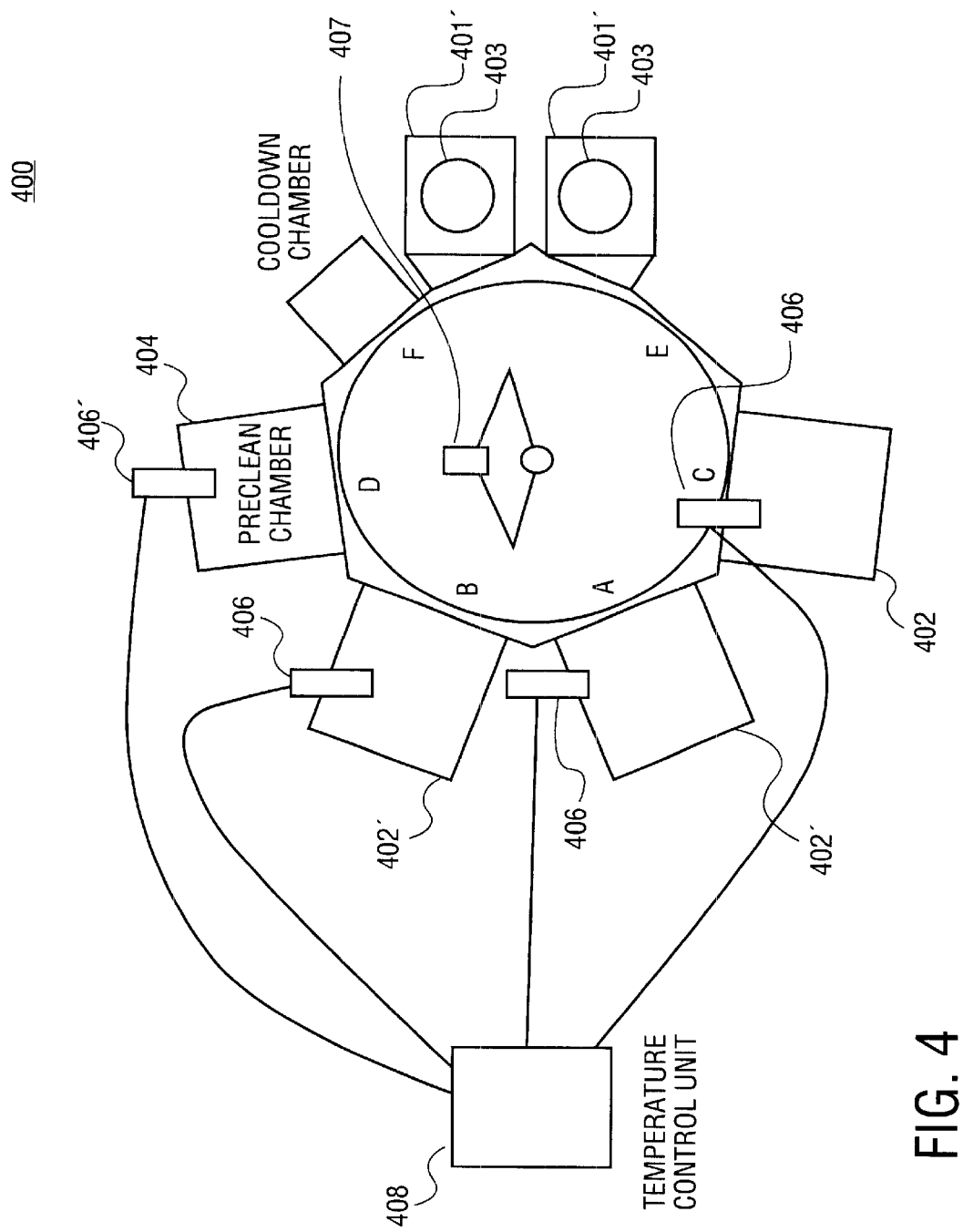
FIG. 4 is an illustration of a cluster tool system.

FIG. 4 is an illustration of a cluster tool system. The cluster tool 400, such as an Epi Centura, can contain multiple backside heating chambers 402 and 402' with wafers 403 robotically fed 407 to and from the chambers 402 and 402' from cartridges 401 and 401'. The backside heating chambers 402 and 402' can all perform a similar function, such as epitaxial deposition, or each perform a different function. Shown in FIG. 4 is a configuration of a system for low temperature epi deposition, which has one EpiClean chamber 404 for pre-epitaxial cleaning and three deposition chambers 402 and 402'. Each chamber 402, 402' and 404 can have an optical thermometer 406 or 406'. The thermometers 406 and 406' can be controlled individually or all together by a single control unit with multiple channels 408. Since the direct lamp radiation above the wafer is minimized, the parasitic signal in the optical thermometers will be minimized, too. The optical thermometers 406 and 406' do not have to be re-calibrated with each change of wafer size and/or circuit pattern, therefore reducing process cycle times.

Backside heating only, achieves immunity to emissivity in temperature dependent processes. This allows reproducibility of thermal processes regardless of the wafer circuit design (pattern) or intrinsic film emissivity. The time spent for tuning a process can be shortened due to this feature. The reactor (process chamber) can be more compact due to the absence of an upper lamp array. Finally, this apparatus will allow a direct probe of the wafer temperature of patterned wafers with unknown emissivity.

Thus, an apparatus for heating a wafer that is emissivity independent through wafer backside heating, reflecting wafer radiant heat back onto the wafer, and minimizing the effects of lamp heat leakage has been described. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. An apparatus comprising:
    a reflector having a mirrored surface facing down;
    a glass structure located beneath the reflector;
    a susceptor within the glass structure having a surface facing up that is capable of holding a part to be processed; and
    one or more radiant heat sources directed at and located beneath the glass structure.

2. The apparatus of claim 1, wherein a portion of the glass structure, that is located between the susceptor and the reflector, is curved to structurally resist pressure differentials.

3. The apparatus of claim 1, wherein a portion of the glass structure, that is located between the susceptor and the reflector, is ribbed to structurally resist pressure differentials.

4. The apparatus of claim 1 wherein t he reflector has an outer layer of reflective material.

5. The apparatus of claim 1, wherein the reflector has a hole through which to determine a temperature.

6. The apparatus of claim 5, wherein the hole is approximately 0.50–1.50 inches in diameter.

7. The apparatus of claim 1, wherein the reflector is substantially flat.

8. The apparatus of claim 1, wherein the reflector is curved to focus heat uniformly back onto the part.

9. The apparatus of claim 1 wherein the reflector is water-cooled.

10. The apparatus of claim 1, wherein the part is a semiconductor wafer.

11. The apparatus of claim 10, wherein the semiconductor wafer is facing device side up.

12. The apparatus of claim 1, wherein the susceptor is centerless, wherein radiation heats the backside of the wafer directly.

13. A wafer processing apparatus, comprising:
    a flat reflector having a mirrored surface facing down;
    a quartz process chamber located beneath the reflector;
    a susceptor within the quartz process chamber having a surface facing up that is capable of holding a wafer;
    a portion of the quartz process chamber positioned between the susceptor and the reflector has a uniform thickness;
    one or more radiant heat sources directed at the susceptor and located beneath the quartz process chamber; and
    a temperature sensing device positioned to read a wafer surface temperature through a hole in the flat reflector.

14. The apparatus of claim 13, further comprising a passage connecting the volume in the quartz process chamber and the volume around the reflector to allow pressure differences to equalize.

15. The apparatus of claim 13, further comprising:
    a first pressure acting in the quartz process chamber;
    a second pressure acting between the quartz process chamber and the reflector; and
    a pressure control system capable of matching the two pressures.

16. The apparatus of claim 13, wherein the reflector has an outer layer of reflective material.

17. The apparatus of claim 16, wherein the reflective material is gold.

* * * * *